US012665407B2

(12) United States Patent
Li et al.

(10) Patent No.: US 12,665,407 B2
(45) Date of Patent: Jun. 23, 2026

(54) LEAKAGE CURRENT DETECTION AND INTERRUPTION DEVICE FOR POWER CORD AND RELATED ELECTRICAL CONNECTORS AND ELECTRICAL APPLIANCES

(71) Applicant: Chengli Li, Suzhou (CN)

(72) Inventors: Chengli Li, Suzhou (CN); Long Chen, Suzhou (CN)

(73) Assignee: Chengli Li, Suzhou (CN)

( * ) Notice: Subject to any disclaimer, the term of this patent is extended or adjusted under 35 U.S.C. 154(b) by 181 days.

(21) Appl. No.: 18/818,335

(22) Filed: Aug. 28, 2024

(65) Prior Publication Data

US 2024/0421582 A1 Dec. 19, 2024

Related U.S. Application Data

(63) Continuation-in-part of application No. 18/349,137, filed on Jul. 8, 2023, now abandoned, and a
(Continued)

(30) Foreign Application Priority Data

| Feb. 13, 2023 | (CN) | ......................... | 202310103339.3 |
| Feb. 13, 2023 | (CN) | ......................... | 202320192198.2 |

(51) Int. Cl.
*H02H 1/00* (2006.01)
*G01R 31/52* (2020.01)
(Continued)

(52) U.S. Cl.
CPC ........... *H02H 1/0061* (2013.01); *G01R 31/52* (2020.01); *G01R 31/58* (2020.01); *H01H 83/02* (2013.01);
(Continued)

(58) Field of Classification Search
CPC .......... H02H 1/0061; H02H 3/16; H02H 1/06; H02H 3/006; H02H 7/261; H02H 3/04;
(Continued)

(56) References Cited

U.S. PATENT DOCUMENTS

| 2020/0393520 | A1* | 12/2020 | Li | ........................... | G01R 31/58 |
| 2023/0402833 | A1* | 12/2023 | Li | ........................... | H02H 3/044 |
| 2024/0426940 | A1* | 12/2024 | Li | ........................... | G01R 31/52 |

FOREIGN PATENT DOCUMENTS

| CN | 116014688 | A | 4/2023 |
| CN | 219498954 | U | 8/2023 |

* cited by examiner

*Primary Examiner* — Raul J Rios Russo
(74) *Attorney, Agent, or Firm* — Chen Yoshimura LLP

(57) ABSTRACT

A leakage current detection and interruption device includes a switch for controlling an electrical connection between input and output ends of power supply lines; a leakage current detection module for generating a leakage fault signal when detecting a leakage current on the power supply lines; a drive module coupled to the leakage current detection module and the switch, for controlling the switch to disconnect or connect the electrical connection; a wireless communication module including a signal processing chip, coupled to the drive module and/or the leakage current detection module and/or the output end, for wirelessly communicating with a remote control device to allow the remote control device to perform at least one of: controlling the switch to disconnect or connect the electrical connection, setting parameters of the device, and obtaining electrical connection information and/or fault information of the device. The device enables remote control and monitor, using a simple structure.

21 Claims, 9 Drawing Sheets

200

Related U.S. Application Data continuation-in-part of application No. 18/169,756, filed on Feb. 15, 2023, now abandoned.

(51) Int. Cl.

| | |
|---|---|
| *G01R 31/58* | (2020.01) |
| *H01H 83/02* | (2006.01) |
| *H02H 1/06* | (2006.01) |
| *H02H 3/00* | (2006.01) |
| *H02H 3/04* | (2006.01) |
| *H02H 3/08* | (2006.01) |
| *H02H 3/16* | (2006.01) |
| *H02H 3/32* | (2006.01) |
| *H02H 3/33* | (2006.01) |
| *H02H 7/26* | (2006.01) |

(52) U.S. Cl.
CPC ............. *H02H 3/16* (2013.01); *H02H 1/0007* (2013.01); *H02H 1/06* (2013.01); *H02H 3/006* (2013.01); *H02H 3/04* (2013.01); *H02H 3/08* (2013.01); *H02H 3/32* (2013.01); *H02H 3/33* (2013.01); *H02H 7/261* (2013.01)

(58) Field of Classification Search
CPC .......... H02H 3/33; H02H 1/0007; H02H 3/08; H02H 3/32; G01R 31/52; G01R 31/58; H01H 83/02
USPC ........................................................ 324/500
See application file for complete search history.

LEAKAGE CURRENT DETECTION AND INTERRUPTION DEVICE FOR POWER CORD AND RELATED ELECTRICAL CONNECTORS AND ELECTRICAL APPLIANCES

BACKGROUND OF THE INVENTION

Field of the Invention

This invention relates to electrical circuits, and in particular, it relates to a leakage current detection and interruption device for a power cord, and related electrical connectors and electrical appliances.

Description of Related Art

With rapid development of technology, the number of appliances that people use in their homes is increasing, and home appliances are increasing becoming smart devices. There is an increased demand for leakage current detection and interruption devices that are safe and that allow remote monitor and control by users. Current leakage current detection and interruption devices have leakage current protection functions but do not enable users to perform remote monitor and control. When the user is not in the physical proximity of the appliances, they cannot monitor the operation of the appliances, such as whether they are functioning properly or have a fault.

SUMMARY

In one aspect, the present invention provides a leakage current detection and interruption device, which includes: a switch module, coupled to power supply lines between an input end and an output end and configured to control an electrical connection between the input end and the output end; a leakage current detection module, configured to detect a leakage current on the power supply lines and to generate a leakage fault signal in response thereto; a drive module, coupled to the leakage current detection module and the switch module, and configured to control the switch module to disconnect or connect the electrical connection between the input end and output end; a wireless communication module, coupled to the drive module and/or the leakage current detection module, and configured to wirelessly communicate with a remote control device to allow the remote control device to perform at least one of: controlling the switch module to disconnect or connect the electrical connection between the input end and output end, setting parameters of the leakage current detection and interruption device, and obtaining electrical information and/or fault information of the leakage current detection and interruption device; and at least one power supply module, configured to supply a power to the leakage current detection module and the wireless communication module.

In some embodiments, the wireless communication module is configured to operate in a timed control mode, wherein in the timed control mode, the wireless communication module is configured to: receive control data from the remote control device, and in response to the control data including a control timing, control the switch module to disconnect or connect the electrical connection between the input end and output end based on the control data at a time indicated by the control timing.

In some embodiments, the wireless communication module is configured to: in response to the control data not including a timing of the commanded operation, control the switch module to disconnect or connect the electrical connection between the input end and output end based on the control data at a time that is either a pre-set timing or a timing indicated by a last control data.

In some embodiments, the wireless communication module is further configured to perform a countdown based on the control timing, and to either transmit countdown information to the remote control device at pre-set time intervals, or transmit the countdown information to the remote control device in response to a request from the remote control device.

In some embodiments, the wireless communication module is configured to operate in a real-time control mode, wherein in the real-time control mode, the wireless communication module receives control data from the remote control device, and controls the switch module to disconnect or connect the electrical connection between the input end and output end based on the control data.

In some embodiments, the wireless communication module controls the switch module to disconnect or connect the electrical connection between the input end and output end based on the control data by: generating a drive module trigger signal based on the control data; and providing the drive module trigger signal to the drive module or the leakage current detection module; and wherein in response to the drive module trigger signal, the drive module controls the switch module to disconnect or connect the electrical connection between the input end and output end.

In some embodiments, the wireless communication module is further configured to: receive the leakage fault signal and store fault information corresponding to the leakage fault signal; and generate a fault alarm signal based on the leakage fault signal, and transmits the alarm signal to the remote control device either at a time of generating the fault alarm signal or in response to a request from the remote control device.

In another aspect, the present invention provides a leakage current detection and interruption (LCDI) device, which includes: a switch module, coupled to power supply lines between an input end and an output end and configured to control an electrical connection between the input end and the output end; a leakage current detection module, configured to detect a leakage current on the power supply lines and to generate a leakage fault signal in response thereto; a drive module, coupled to the leakage current detection module and the switch module, and configured to control the switch module to disconnect or connect the electrical connection between the input end and output end; a wireless communication module, coupled to the output end of the power supply lines and configured to detect a power loss at the output end, wherein the wireless communication module is further configured to wirelessly transmit information regarding the power loss to a remote control device; and at least one power supply module, configured to supply a power to the leakage current detection module and the wireless communication module.

In some embodiments, the wireless communication module is configured to transmit the information regarding the power loss to the remote control device upon detecting the power loss.

In some embodiments, the wireless communication module is configured to store the information regarding the power loss, and to transmit the information regarding the power loss to the remote control device in response to a request from the remote control device.

The leakage current detection module may include at least one leakage current detection ring and a signal processing circuit coupled to the at least one leakage current detection ring. The drive module may include a drive coil and a drive circuit coupled in series to the drive coil. The wireless communication module may include a signal processing chip and at least one semiconductor switch or photocoupler coupled to the chip. In some embodiments, the wireless communication module includes a semiconductor switch having its control electrode coupled to an output pin the chip and its current path coupled in parallel with a current path of the drive coil of the drive module. In some embodiments, the wireless communication module includes a semiconductor switch having its control electrode coupled to an output of the signal processing circuit of the leakage current detection module and its current path coupled to an input pin of the signal processing chip. In some embodiments, the wireless communication module includes a semiconductor switch having its control electrode coupled to an output of a self-test circuit and its current path coupled to an input pin of the signal processing chip. In another embodiment, the wireless communication module includes a photocoupler coupled between the signal processing chip and the output end of the power supply lines.

In another aspect, the present invention provides an electrical power connection device, which includes a body and any of the above leakage current detection and interruption device disposed inside the body.

In yet another aspect, the present invention provides an electrical appliance, which includes an electrical load and an electrical power connection device coupled between a power supply and the electrical load, configured to supply power to the electrical load, wherein the electrical power connection device includes any of the above leakage current detection and interruption device.

The leakage current detection and interruption device according to embodiments of the present invention can allow the user to obtain electrical information and/or fault information f the leakage current detection and interruption device via remote control devices, as well as to set parameters of the leakage current detection and interruption device. This achieves remote control and monitoring of the leakage current detection and interruption device. Moreover, the leakage current detection and interruption device has a simple electrical structure, is low cost and reliable.

BRIEF DESCRIPTION OF THE DRAWINGS

Preferred embodiments of the present invention are described with reference to the drawings. These drawings explain the embodiments and their operating principle, and only illustrate structures that are necessary to the understanding of the invention. These drawings are not to scale. In the drawings, like features are designated by like reference symbols. In the block diagrams, lines between blocks represent electrical or magnetic coupling of the blocks; the absence of lines between blocks does not mean the lack of coupling.

DETAILED DESCRIPTION OF PREFERRED EMBODIMENTS

Preferred embodiments of the present invention are described below with reference to the drawings. These drawings and descriptions explain embodiments of the invention but do not limit the invention. The described embodiments are not all possible embodiments of the present invention. Other embodiments are possible without departing from the spirit and scope of the invention, and the structure and/or logic of the illustrated embodiments may be modified. Thus, it is intended that the scope of the invention is defined by the appended claims.

Before describing the embodiments, some terms used in this disclosure are defined here to help the reader better understand this disclosure.

In this disclosure, terms such as "connect", "couple", "link" etc. should be understood broadly, without limitation to physical connection or mechanical connection, but can include electrical connection, and can include direct or indirection connections. Terms such as "a" and "one" do not limit the quantity, and refers to "at least one".

In the descriptions below, terms such as "including" are intended to be open-ended and mean "including without limitation", and can include other contents. "Based on" means "at least partly based on." "An embodiment" means "at least one embodiment." "Another embodiment" means "at least another embodiment," etc. In this disclosure, the above terms do not necessarily refer to the same embodiments. Further, the various features, structures, materials or characteristics may be suitably combined in any of the one or more embodiments. Those of ordinary skill in the art may combine the various embodiments and various characteristics of the embodiments described herein when they are not contrary to each other.

Embodiments of the present invention provide a leakage current detection and interruption device that includes a wireless communication module for communication with remote control devices. It enables users to use the remote control device to remotely obtain electrical information and/or fault information and set control parameters of the leakage current detection and interruption device. This allows for remote control and monitoring. Further, the leakage current detection and interruption device has a simple electrical structure, is low cost, and reliable.

Figure 1:
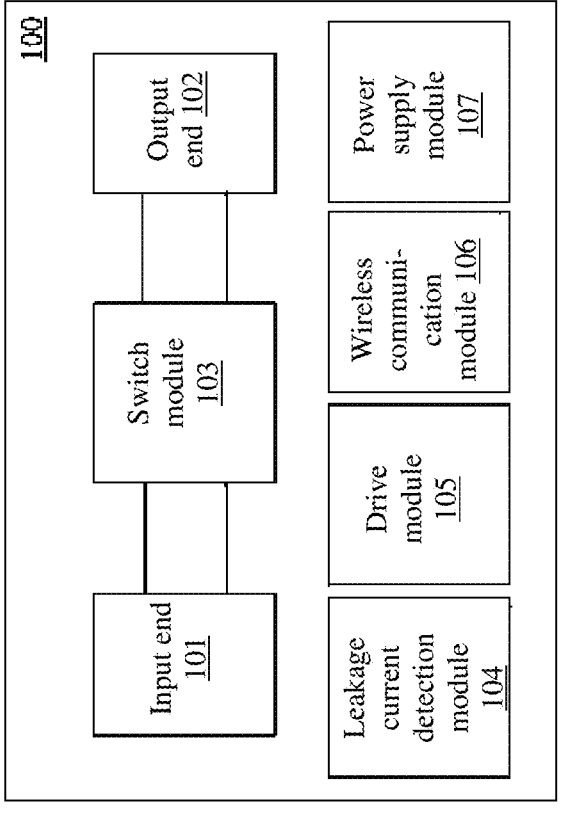
FIG. 1 is a block diagram of a leakage current detection and interruption device according to embodiments of the present invention.

FIG. 1 is a block diagram of a leakage current detection and interruption device according to embodiments of the present invention. As shown in FIG. 1, the leakage current detection and interruption device 100 includes a switch module 103, a leakage current detection module 104, a drive module 105, a wireless communication module 106 and at least one power supply module 107.

The switch module 103 is coupled between the input end 101 and output end 102 of the power lines, and controls the electrical connection between the input end 101 and the output end 102. The leakage current detection module 104 functions to generate a leakage fault signal when a leakage fault is present on the power lines. When the power lines has a leakage fault, a leakage current is present on the power lines, and the leakage current detection module 104 detects such leakage current and generates the leakage fault signal. The drive module 105 is coupled to the leakage current detection module 104 and switch module 103, and controls the open/close state of the leakage current detection module 104 to disconnect or connect the electrical connection between the input end 101 and output end 102. When the leakage current detection module 104 generates the leakage fault signal, the drive module 105 receives such leakage fault signal, and in response thereto, drives the switch module 103 to disconnect the electrical connection between the input end 101 and output end 102.

The wireless communication module 106 is coupled to the drive module 105 and/or leakage current detection module 104, and communicates with remote control devices, to allow the remote control devices to perform at least one of the following functions: to control the switch module 103 to disconnect or connect the electrical connection between the input end 101 and output end 102; to set parameters of the leakage current detection and interruption device 100; and to obtain electrical information and/or fault information of the leakage current detection and interruption device 100.

The at least one power supply module 107 (there may be one or more power supply modules) supplies power to the leakage current detection module 104 and wireless communication module 106. The power supply module 107 may convert the AC (alternating current) power on the power supply lines to a DC (direct current) power and supply the DC power to the leakage current detection module 104 and wireless communication module 106.

The remote control device may be any suitable devices that has wireless communication functions, such as a smart phone, a notebook computer, a desktop computer, a tablet computer, a control station, a handheld control device, etc. The remote control device may include control software and/or mechanical control switches. The parameters includes any of the programmable parameters of the leakage current detection and interruption device 100, such as programmed times for connecting and disconnecting electrical power, etc. It should be understood that the leakage current detection and interruption device 100 may further include an electrical measurement module such as current measurement module or voltage measurement module (not shown in the drawings), and the wireless communication module 106 may be further coupled to one of more of these measurement modules, receive electrical measurement data such as current and voltage values from these modules, and store the corresponding data in its memory and/or transmit the data to the remote control device (for example, it may transmit the data in response to receiving an inquiry from the remote control device). The electrical information may include one or more of the following for the leakage current detection and interruption device 100: real-time or historical electrical data, measurement time, number of measurements, trend plot, etc. Further, in addition to the leakage current detection module 104, the leakage current detection and interruption device 100 may further include other fault detection modules that detect other fault conditions such as leakage current fault, over-current fault, short circuit fault, overload fault, etc. The wireless communication module 106 may be coupled to one more of such fault detection modules, and in response to these modules detecting the corresponding fault conditions, receive the fault signals from the fault detection modules, store corresponding fault data in its memory and/or transmit the fault data to the remote control device (for example, it may transmit the fault data automatically when fault occurs, or transmit the fault data in response to receiving an inquiry from the remote control device). The fault data may include one or more of: the type of fault, the time it occurred, number of times that the same type of fault occurred in the past, suggestions for handling the fault, etc.

To summarize, the leakage current detection and interruption device 100 according to embodiments of the present invention can communicate with remote control devices via the wireless communication module 106, enabling the user to obtain electrical information and/or fault information via the remote control device 108, as well as to set parameters of the leakage current detection and interruption device. This achieves remote control and monitoring of the leakage current detection and interruption device 100. Moreover, the leakage current detection and interruption device 100 has a simple electrical structure, is low cost and reliable.

In some embodiments, the wireless communication module 106 can be operated in a timed control mode. In this mode, the wireless communication module 106 receives control data from the remote control device 108, and if the control data indicates a control timing, then the wireless communication module 106 controls the switch module 103 to disconnect or connect the electrical connection between the input end 101 and output end 102 at the time indicated by the control data. More specifically, for example, the control data may include a control command to disconnect or connect the power and a specific time of the commanded operation (e.g., to disconnect power at 18:00 hours), or a control command and the time interval until the commanded operation (e.g., to disconnect power in 5 hours). The user may use the remote control device 108 to set the control commands and the timing. After the wireless communication module 106 receives the control data, it controls the switch module 103 to disconnect or connect power as instructed by the control data at the time indicated by the control data.

The wireless communication module 106 may be coupled to one or both of the leakage current detection module 104 and drive module 105; when it needs to control the switch module 103, the wireless communication module 106 generates an appropriate drive module trigger signal based on the control data, and provides the trigger signal to the drive module 105 or leakage current detection module 104. In turn, the drive module 105 controls the switch module 103 to disconnect or connect the electrical connection between the input end 101 and output end 102.

In some embodiments, in the timed control mode, if the control data does not indicate a timing of the commanded operation, e.g. the user did not set the control timing (time point or time interval), then the timing of the operation may be a pre-set timing (e.g. a default timing), or the timing indicated by the last control data, so the wireless communication module 106 may control the switch module 103 based on the control data and such control timing, to disconnect or connect the electrical connection between the input end 101 and output end 102. By using the above timed control mode, the user may set the on/off timing of the electrical appliance based on his need.

In some embodiments, the wireless communication module 106 may perform a countdown based on the control timing, and can transmit countdown information to the remote control device 108 at pre-set time intervals. Further, the remote control device 108 may transmit requests to the wireless communication module 106 regarding the countdown, and the wireless communication module transmits the countdown information to the remote control device in response to such requests. The user may check countdown information via the remote control device.

In some embodiments, the wireless communication module 106 may operate in a real-time control mode. In the real-time control mode, the wireless communication module 106 receives control data from the remote control device 108, and in response thereto, control the switch module 103 to disconnect or connect the electrical connection between the input end 101 and output end 102. More specifically, for example, the control data may include a control command to disconnect or connect the power. The user may use the remote control device 108 to set the control commands. When the wireless communication module 106 receives the control data, it controls the switch module 103 to disconnect or connect power as instructed by the control command. The wireless communication module 106 may be coupled to one or both of the leakage current detection module 104 and drive module 105; when it needs to control the switch module 103, the wireless communication module 106 generates an appropriate drive module trigger signal based on the control data, and provides the trigger signal to the drive module 105 or leakage current detection module 104. In turn, the drive module 105 controls the switch module 103 to disconnect or connect the electrical connection between the input end 101 and output end 102. Using the real-time control mode, the user may conveniently control the on/off of the electrical appliance in real time based on his need.

In some embodiments, the wireless communication module 106 may receive the leakage fault signal and store corresponding fault information, and generate a fault alarm signal based on the leakage fault signal and transmits the alarm signal to the remote control device. This way, the fault condition may be timely reported to the user, allowing the user to deal with the fault condition. Further, the remote control device 108 may issue inquiries to the wireless communication module 106, and the wireless communication module 106 transmits the fault information to the remote control device in response to the inquiry.

Figure 2:
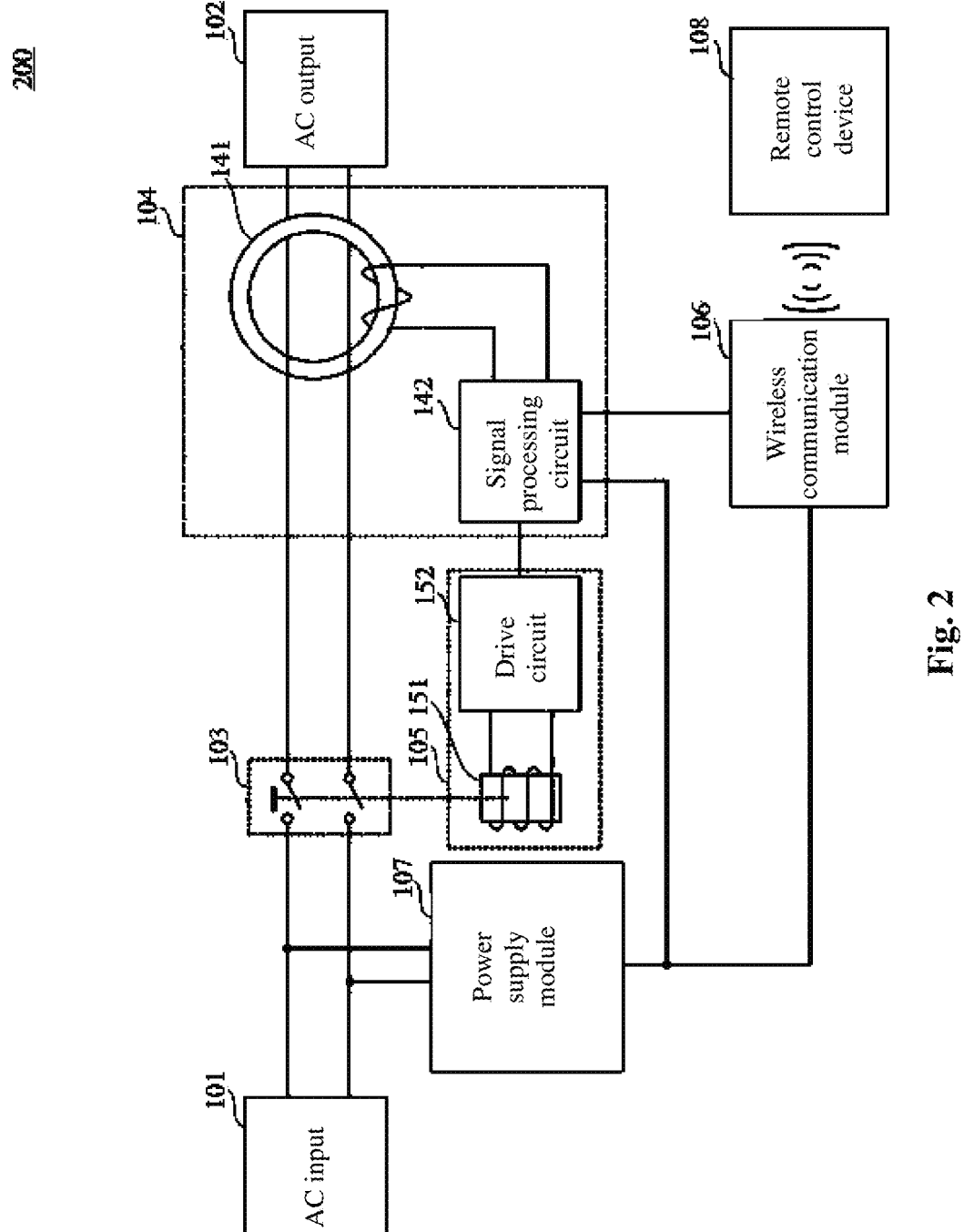
FIG. 2 illustrates a leakage current detection and interruption device according to a first embodiment of the present invention.

FIG. 2 illustrates a leakage current detection and interruption device 200 according to a first embodiment of the present invention. As shown in FIG. 2, the leakage current detection and interruption device 200 includes a switch module 103, leakage current detection module 104, drive module 105, wireless communication module 106, and power supply module 107. The power lines include two current-carrying wires. As shown in FIG. 2, the switch module 103 includes a reset switch which controls the electrical connection of the two current-carrying wires between the input end 101 and output end 102. The leakage current detection module 104 includes a leakage current detection ring 141 through which the two current-carrying wires pass, and a signal processing circuit 142 coupled in series to the leakage current detection ring 141. The signal processing circuit 142 may include, for example, a leakage current detection chip and related circuits. The drive module 105 includes a drive coil 151 and a drive circuit 152 coupled in series to the drive coil 151. The drive circuit 152 may include, for example, at least one semiconductor device such as a silicon controlled rectifier, bipolar transistor, field effect transistor, photoelectric coupling element, or the like. The signal processing circuit 142 is coupled in series with the drive circuit 152. The drive coil 151 generates an electromagnetic force that drives the switch module 103. The drive circuit 152 causes the drive coil 151 to generate the electromagnetic force when the signal processing circuit 142 generates a leakage fault signal, to drive the switch module 103 to disconnect the electrical connection between the input end 101 and output end 102.

The wireless communication module 106 is coupled to the signal processing circuit 142, and wirelessly communicates with the remote control device 108. By communicating with the wireless communication module 106, the remote control device 108 can control the switch module 103 to disconnect or connect the electrical connection between the input end 101 and output end 102, set parameters of the leakage current detection and interruption device 200, and obtain electrical information and/or fault information of the leakage current detection and interruption device. The power supply module 107 is coupled to the two current-carrying wires, the signal processing circuit 142 and the wireless communication module 106, and functions to convert the AC power on the current-carrying wires to a DC power and supply it to the signal processing circuit 142 and the wireless communication module 106.

Under normal working conditions, the two current-carrying wires are coupled to the power grid, and the switch module 103 is in the reset (i.e. closed) state, so the AC input end 101 and AC output end 102 are electrically connected to each other. When one or both of the two current-carrying wires has a leakage current, i.e., the power lines have a leakage current or leakage fault, the leakage current detection ring 141 detects a current imbalance on the two current-carrying wires, and generates a corresponding leakage signal (e.g., an induced voltage), and couples the leakage signal to the signal processing circuit 142. The signal processing circuit 142 compares the leakage signal to a threshold value, and when the leakage signal is greater than the threshold value, the signal processing circuit 142 generates the leakage fault signal, and couples the leakage fault signal to the drive circuit 152. This triggers the drive circuit 152, which in turn causes a change in the current flowing through the drive coil 151, thereby generating a corresponding electromagnetic force to drive the switch module 103 to disconnect the electrical connection between the input end 101 and output end 102. The signal processing circuit 142 further couples the leakage fault signal to the wireless communication module 106. The wireless communication module 106 stores the fault data corresponding to the leakage fault signal in its memory and/or transmit the fault data to the remote control device 108. The fault data may include one or more of: the type of fault (leakage fault), the time it occurred, number of times that the same type of fault occurred in the past, suggestions for handling the fault, etc.

The wireless communication module 106 can operate in a real-time control mode or a timed control mode. For example, a user may install a remote control application on the smart phone or computer, and use the application to select real-time control mode or timed control mode, and set relevant control parameters in the selected mode. In other examples, a hand-held control device may be provided with a mechanical mode selection switch to allow the user to select real-time control mode or timed control mode.

In the real-time control mode, the user transmits control data to the wireless communication module 106 using the remote control device 108. The control data may include a control command to disconnect or connect the power. In response to receiving such control command, the wireless communication module 106 controls the switch module 103 to disconnect or connect the electrical connection. For example, the user uses the remote control device 108 to select the real-time control mode and set the control data to disconnect the electrical connection. The remote control device 108 transmits the control data to the wireless communication module 106. When the wireless communication module 106 receives the control data, it generates a drive module trigger signal (e.g., a simulated leakage signal), and provides the drive module trigger signal to the signal processing circuit 142. The signal processing circuit 142 compares the drive module trigger signal to the threshold value, and when the drive module trigger signal is greater than the threshold value, the signal processing circuit 142 generates a leakage fault signal and couples the signal to the drive circuit 152. This triggers the drive circuit 152, which in turn causes a change in the current flowing through the drive coil 151, thereby generating a corresponding electromagnetic force to drive the switch module 103 to disconnect the electrical connection between the input end 101 and output end 102.

In the timed control mode, the user transmits control data to the wireless communication module 106 using the remote control device 108. The control data may include a control command to disconnect or connect the power. If the control data includes a timing of the commanded operation, such as a specific time point or a time interval from the present time, the wireless communication module 106 controls the switch module 103 to disconnect or connect the electrical connection at the time set by the control data. If the control data does not indicate a timing of the commanded operation, e.g. it does not include the time point or time interval, then the wireless communication module 106 may control the switch module 103 to disconnect or connect the electrical connection based on a pre-set timing or the timing indicated by the last control data. For example, if the user uses the remote control device 108 to select the timed control mode and sets a control data to disconnect the power a specific time point, the remote control device 108 transmits this control data to the wireless communication module 106. As the control data includes the control timing, the wireless communication module 106 performs a countdown based on the control timing, and transmits countdown information to the remote control 108 device at pre-set time intervals. If, on the other hand, the control data does not include control timing, the wireless communication module 106 performs a countdown based on the pre-set timing or the timing indicated by the last control data, and transmits countdown information to the remote control 108 device at pre-set time intervals. The user may check countdown information via the remote control device 108. When the time of operation arrives at the end of the countdown, the wireless communication module 106 generates a drive module trigger signal (e.g., a simulated leakage signal), and provides the drive module trigger signal to the signal processing circuit 142. The signal processing circuit 142 compares the drive module trigger signal to the threshold value, and when the drive module trigger signal is greater than the threshold value, the signal processing circuit 142 generates a leakage fault signal and couples the signal to the drive circuit 152. This triggers the drive circuit 152, which in turn causes a change in the current flowing through the drive coil 151, thereby generating a corresponding electromagnetic force to drive the switch module 103 to disconnect the electrical connection between the input end 101 and output end 102.

Figure 3:
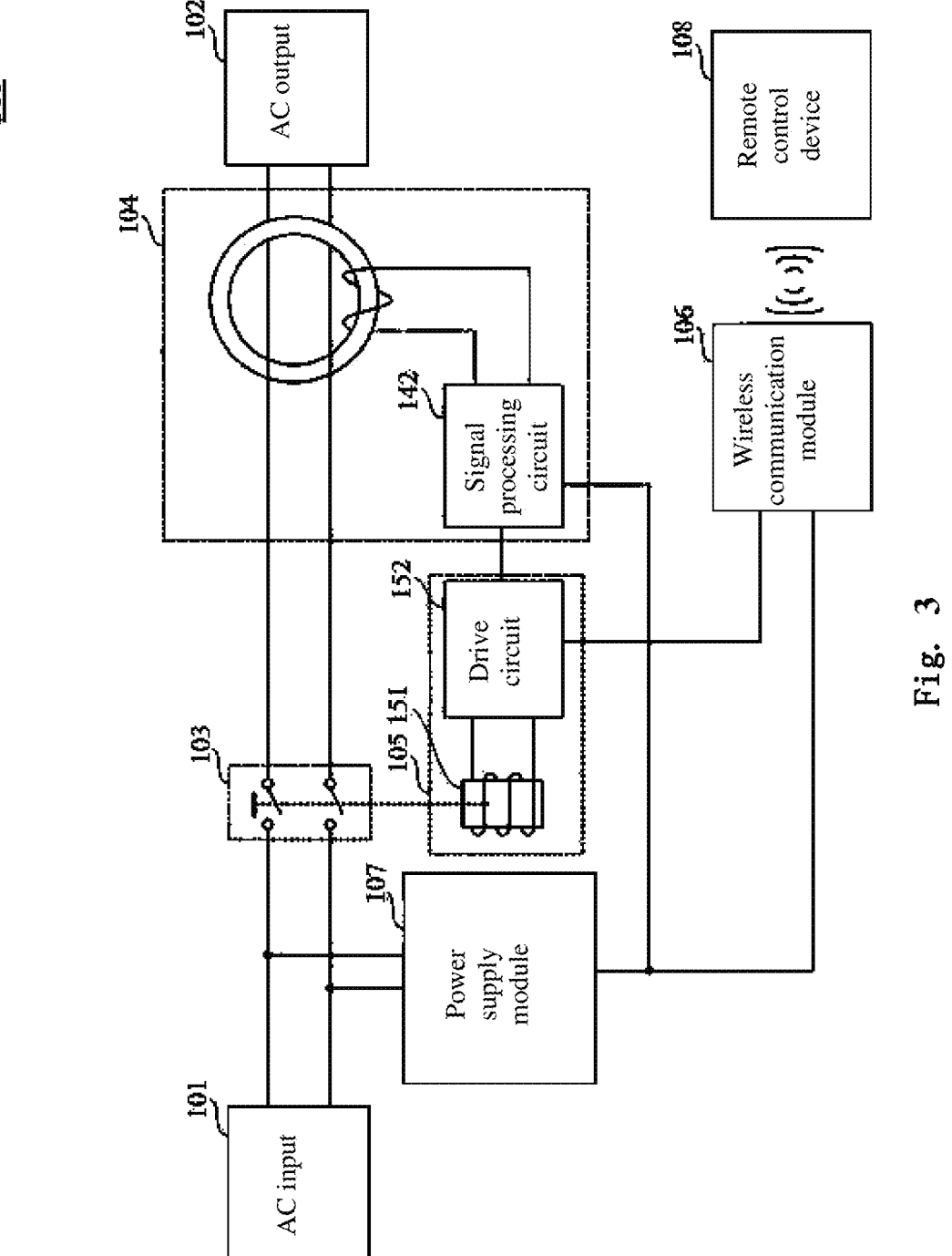
FIG. 3 illustrates a leakage current detection and interruption device according to a second embodiment of the present invention.

FIG. 3 illustrates a leakage current detection and interruption device 300 according to a second embodiment of the present invention. The embodiment of FIG. 3 is similar to the embodiment of FIG. 2, but the wireless communication module 106 is coupled to the drive circuit 152 of the drive module 105, rather than to the signal processing circuit 142.

Under normal working conditions, the two current-carrying wires are coupled to the power grid, and the switch module 103 is in the reset (i.e. closed) state, so the AC input end 101 and AC output end 102 are electrically connected to each other. When one or both of the two current-carrying wires has a leakage current, i.e., the power lines have a leakage current or leakage fault, the leakage current detection ring 141 detects a current imbalance on the two current-carrying wires, and generates a corresponding leakage signal (e.g., an induced voltage), and couples the leakage signal to the signal processing circuit 142. The signal processing circuit 142 compares the leakage signal to a threshold value, and when the leakage signal is greater than the threshold value, the signal processing circuit 142 generates the leakage fault signal, and couples the leakage fault signal to the drive circuit 152. This triggers the drive circuit 152, which in turn causes a change in the current flowing through the drive coil 151, thereby generating a corresponding electromagnetic force to drive the switch module 103 to disconnect the electrical connection between the input end 101 and output end 102.

The wireless communication module 106 can operate in a real-time control mode or a timed control mode. For example, a user may install a remote control application on the smart phone or computer, and use the application to select real-time control mode or timed control mode, and set relevant control parameters in the selected mode. In other examples, a hand-held control device may be provided with a mechanical mode selection switch to allow the user to select real-time control mode or timed control mode.

In the real-time control mode, the user transmits control data to the wireless communication module 106 using the remote control device 108. The control data may include a control command to disconnect or connect the power. In response to receiving such control command, the wireless communication module 106 controls the switch module 103 to disconnect or connect the electrical connection. For example, the user may use the remote control device 108 to select the real-time control mode, and set the control data to disconnect the electrical connection. The remote control device 108 transmits the control data to the wireless communication module 106. When the wireless communication module 106 receives the control data, it generates a drive module trigger signal (e.g., a simulated leakage fault signal), and provides the drive module trigger signal to the drive circuit 152. This triggers the drive circuit 152, which in turn causes a change in the current flowing through the drive coil 151, thereby generating a corresponding electromagnetic force to drive the switch module 103 to disconnect the electrical connection between the input end 101 and output end 102.

In the timed control mode, the user transmits control data to the wireless communication module 106 using the remote control device 108. The control data may include a control command to disconnect or connect the power. If the control data includes a timing of the commanded operation, such as a specific time point or a time interval from the present time, the wireless communication module 106 controls the switch module 103 to disconnect or connect the electrical connection at the time set by the control data. If the control data does not indicate a timing of the commanded operation, e.g. it does not include the time point or time interval, then the wireless communication module 106 may control the switch module 103 to disconnect or connect the electrical connection based on a pre-set timing or the timing indicated by the last control data. For example, if the user uses the remote control device 108 to select the timed control mode and sets a control data to disconnect the power a specific time point or time interval, the remote control device 108 transmits this control data to the wireless communication module 106. As the control data includes the control timing, the wireless communication module 106 performs a countdown based on the control timing, and transmits countdown information to the remote control 108 device at pre-set time intervals. If, on the other hand, the control data does not include control timing, the wireless communication module 106 performs a countdown based on the pre-set timing or the timing indicated by the last control data, and transmits countdown information to the remote control 108 device at pre-set time intervals. The user may check countdown information via the remote control device 108. When the time of operation arrives at the end of the countdown, the wireless communication module 106 generates a drive module trigger signal (e.g., a simulated leakage fault signal), and provides the drive module trigger signal to the drive circuit 152. This triggers the drive circuit 152, which in turn causes a change in the current flowing through the drive coil 151, thereby generating a corresponding electromagnetic force to drive the switch module 103 to disconnect the electrical connection between the input end 101 and output end 102.

Figure 4:
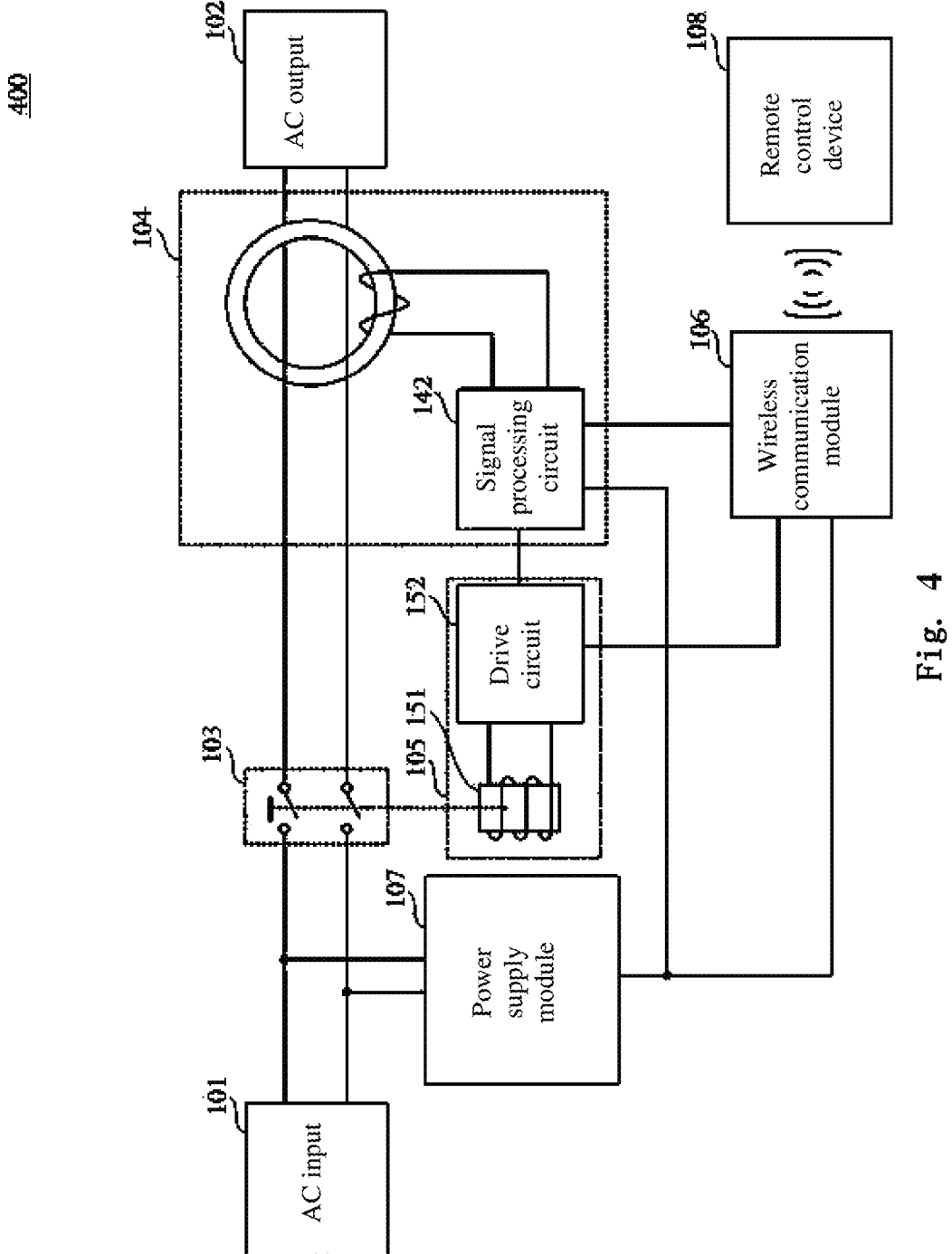
FIG. 4 illustrates a leakage current detection and interruption device according to a third embodiment of the present invention.

FIG. 4 illustrates a leakage current detection and interruption device 400 according to a third embodiment of the present invention. The embodiment of FIG. 4 is similar to the embodiment of FIG. 2, but the wireless communication module 106 is coupled to both the signal processing circuit 142 of the leakage current detection module 104 and the drive circuit 152 of the drive module 105.

Under normal working conditions, the two current-carrying wires are coupled to the power grid, and the switch module 103 is in the reset (i.e. closed) state, so the AC input end 101 and AC output end 102 are electrically connected to each other. When one or both of the two current-carrying wires has a leakage current, i.e., the power lines have a leakage current or leakage fault, the leakage current detection ring 141 detects a current imbalance on the two current-carrying wires, generates a corresponding leakage signal (e.g., an induced voltage), and couples the leakage signal to the signal processing circuit 142. The signal processing circuit 142 compares the leakage signal to a threshold value, and when the leakage signal is greater than the threshold value, the signal processing circuit 142 generates the leakage fault signal, and couples the leakage fault signal to the drive circuit 152. This triggers the drive circuit 152, which in turn causes a change in the current flowing through the drive coil 151, thereby generating a corresponding electromagnetic force to drive the switch module 103 to disconnect the electrical connection between the input end 101 and output end 102. The signal processing circuit 142 further couples the leakage fault signal to the wireless communication module 106. The wireless communication module 106 stores fault data corresponding to the leakage fault signal in its memory and/or transmit the fault data to the remote control device 108. The fault data may include one or more of: the type of fault (leakage fault), the time it occurred, number of times that the same type of fault occurred in the past, suggestions for handling the fault, etc.

The wireless communication module 106 can operate in a real-time control mode or a timed control mode. For example, a user may install a remote control application on the smart phone or computer, and use the application to select real-time control mode or timed control mode, and set relevant control parameters in the selected mode. In other examples, a hand-held control device may be provided with a mechanical mode selection switch to allow the user to select real-time control mode or timed control mode.

In the real-time control mode, the user transmits control data to the wireless communication module 106 using the remote control device 108. The control data may include a control command to disconnect or connect the power. In response to receiving such control command, the wireless communication module 106 controls the switch module 103 to disconnect or connect the electrical connection. For example, the user uses the remote control device 108 to select the real-time control mode, and set the control data to disconnect the electrical connection. The remote control device 108 transmits the control data to the wireless communication module 106. When the wireless communication module 106 receives the control data, it generates a drive module trigger signal (e.g., a simulated leakage fault signal), and provides the drive module trigger signal to the drive circuit 152. This triggers the drive circuit 152, which in turn causes a change in the current flowing through the drive coil 151, thereby generating a corresponding electromagnetic force to drive the switch module 103 to disconnect the electrical connection between the input end 101 and output end 102.

In the timed control mode, the user transmits control data to the wireless communication module 106 using the remote control device 108. The control data may include a control command to disconnect or connect the power. If the control data includes a timing of the commanded operation, such as a specific time point or a time interval from the present time, the wireless communication module 106 controls the switch module 103 to disconnect or connect the electrical connection at the time indicated by the control data. If the control data does not indicate a timing of the commanded operation, e.g. it does not include the time point or time interval, then the wireless communication module 106 may control the switch module 103 to disconnect or connect the electrical connection based on a pre-set timing or the timing indicated by the last control data. For example, if the user uses the remote control device 108 to select the timed control mode and sets a control data to disconnect the power a specific time point, the remote control device 108 transmits this control data to the wireless communication module 106. As the control data includes the control timing, the wireless communication module 106 performs a countdown based on the control timing, and transmits countdown information to the remote control 108 device at pre-set time intervals. If, on the other hand, the control data does not include control timing, the wireless communication module 106 performs a countdown based on the pre-set timing or the timing indicated by the last control data, and transmits countdown information to the remote control 108 device at pre-set time intervals. The user may check countdown information via the remote control device 108. When the time of operation arrives at the end of the countdown, the wireless communication module 106 generates a drive module trigger signal (e.g., a simulated leakage fault signal), and provides the drive module trigger signal to the drive circuit 152. This triggers the drive circuit 152, which in turn causes a change in the current flowing through the drive coil 151, thereby generating a corresponding electromagnetic force to drive the switch module 103 to disconnect the electrical connection between the input end 101 and output end 102.

Figure 5:
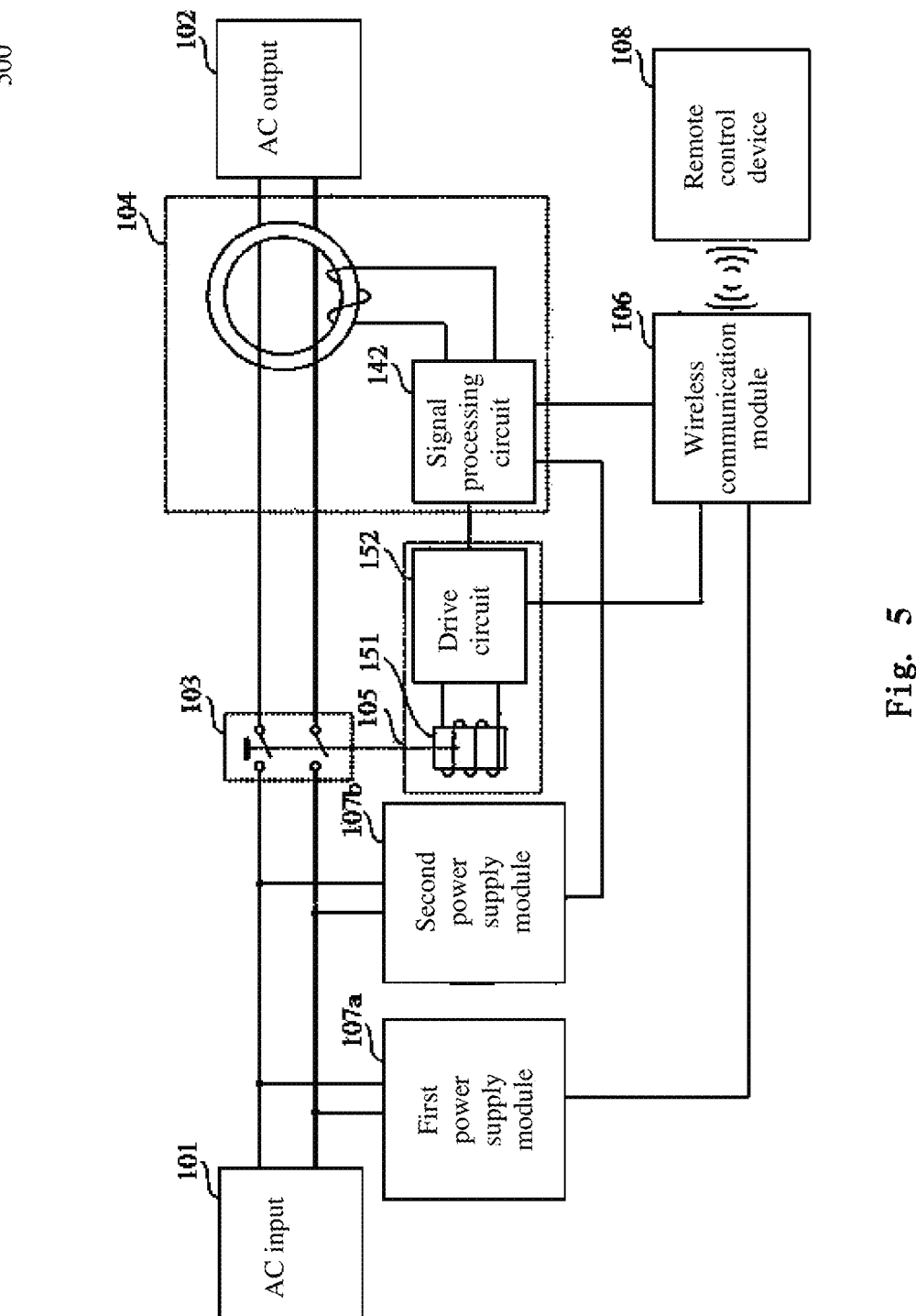
FIG. 5 illustrates a leakage current detection and interruption device according to a fourth embodiment of the present invention.

FIG. 5 illustrates a leakage current detection and interruption device 500 according to a fourth embodiment of the present invention. The embodiment of FIG. 5 is similar to the embodiment of FIG. 4, but includes two power supply modules 107a and 107b. The first power supply module 107*a* is coupled to the two current-carrying wires and the wireless communication module 106, and converts the AC power on the two current-carrying wires to a DC power and supplies it to the wireless communication module 106. The second power supply module 107*b* is coupled to the two current-carrying wires and the signal processing circuit 142, and converts the AC power on the two current-carrying wires to a DC power and supplies it to the signal processing circuit 142. The operation principles are otherwise similar to those of the embodiment of FIG. 4.

Figure 6:
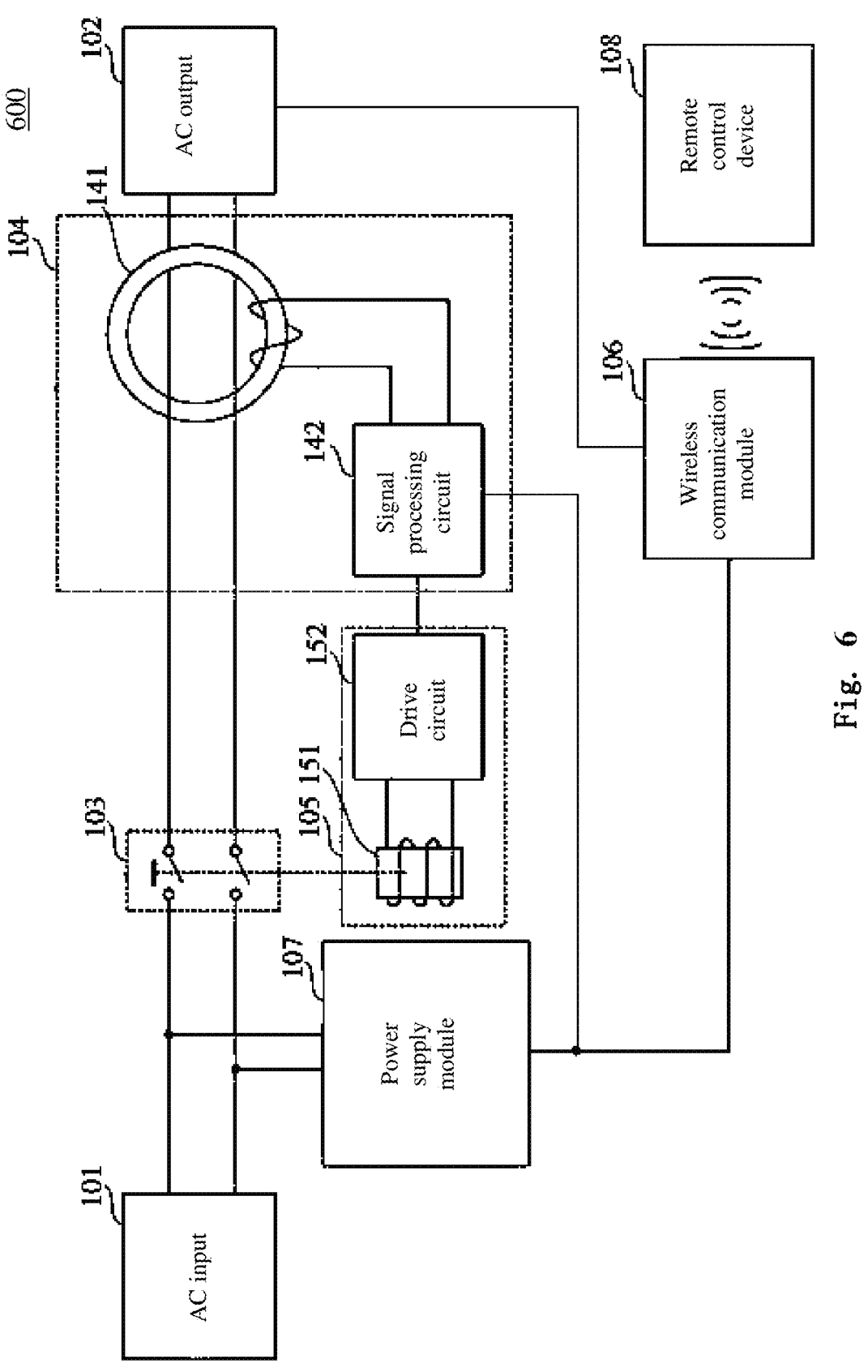
FIG. 6 illustrates a leakage current detection and interruption device according to a fifth embodiment of the present invention.

FIG. 6 illustrates a leakage current detection and interruption device 600 according to a fifth embodiment of the present invention. The device includes a switch module 103 coupled between the input end 101 and output end 102, a leakage current detection module 104, a drive module 105, a wireless communication module 106, and a power supply module 107. The structures and functions of these components are similar to those of the first embodiment shown in FIG. 2, except that the wireless communication module 106 in FIG. 6 is not coupled to the leakage current detection module 104 but is coupled to the AC output 102, and its functions are different from those of the wireless communication module 106 of FIG. 2.

In the embodiment of FIG. 6, the wireless communication module 106 operates to monitor whether the AC output 102 is receiving power or not. Power loss at the output end 102 will indicate that the switch 103 is open due to a leakage, other fault or other conditions. The monitoring may be intermittent or continuous. The wireless communication module 106 stores the information regarding the powered status of the AC output 102, and transmits the information to the remote control device 108. For example, the wireless communication module 106 may transmit an alarm signal indicating a power loss to the remote control device 108 immediately upon detecting that the output end 102 has lost power. Alternatively, the wireless communication module 106 may transmit a reply to the remote control device 108 in response to a request from the remote control device 108, to indicate the power status of the output end 102 and/or the power status history.

In the embodiment of FIG. 6, because the wireless communication module 106 is not coupled to the leakage current detection module 104 or the drive module 105, the wireless communication module 106 does not perform the function of controlling the switch module 103 to connect or disconnect the power, or setting parameters of the leakage current detection and interruption device, which are performed by the wireless communication module 106 in the embodiments of FIGS. 2-4.

In further alternative embodiments (not shown in the drawings), the wireless communication module 106 is coupled to the output end 102 as in the embodiment of FIG. 6, and also coupled to the leakage current detection module 104 and/or the drive module 105 as in the embodiments of FIG. 2, 3 or 4. The wireless communication module 106 in such further embodiments may perform the functions of the wireless communication module 106 of the embodiment of FIG. 6 (e.g. monitoring the output end 102, and transmitting the power status information to the remote control device 108), and also perform all or some of the functions of the wireless communication module 106 of the embodiment of FIG. 2, 3 or 4 described earlier.

Figure 7A:
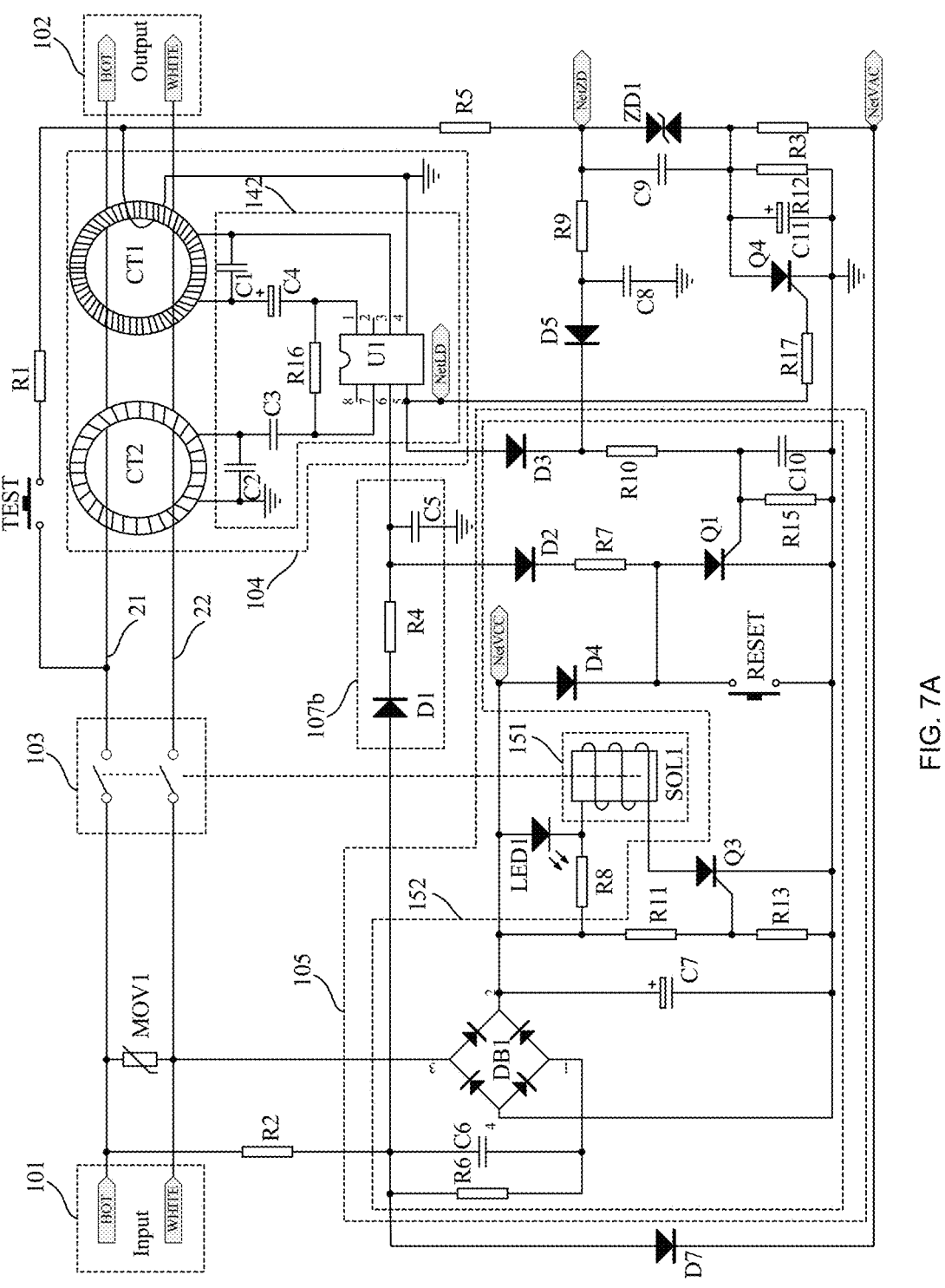
FIGS. 7A, 7B and 7C are circuit diagrams that illustrate further details of the embodiments shown in FIG. 5 and FIG. 6.
Figure 7B:
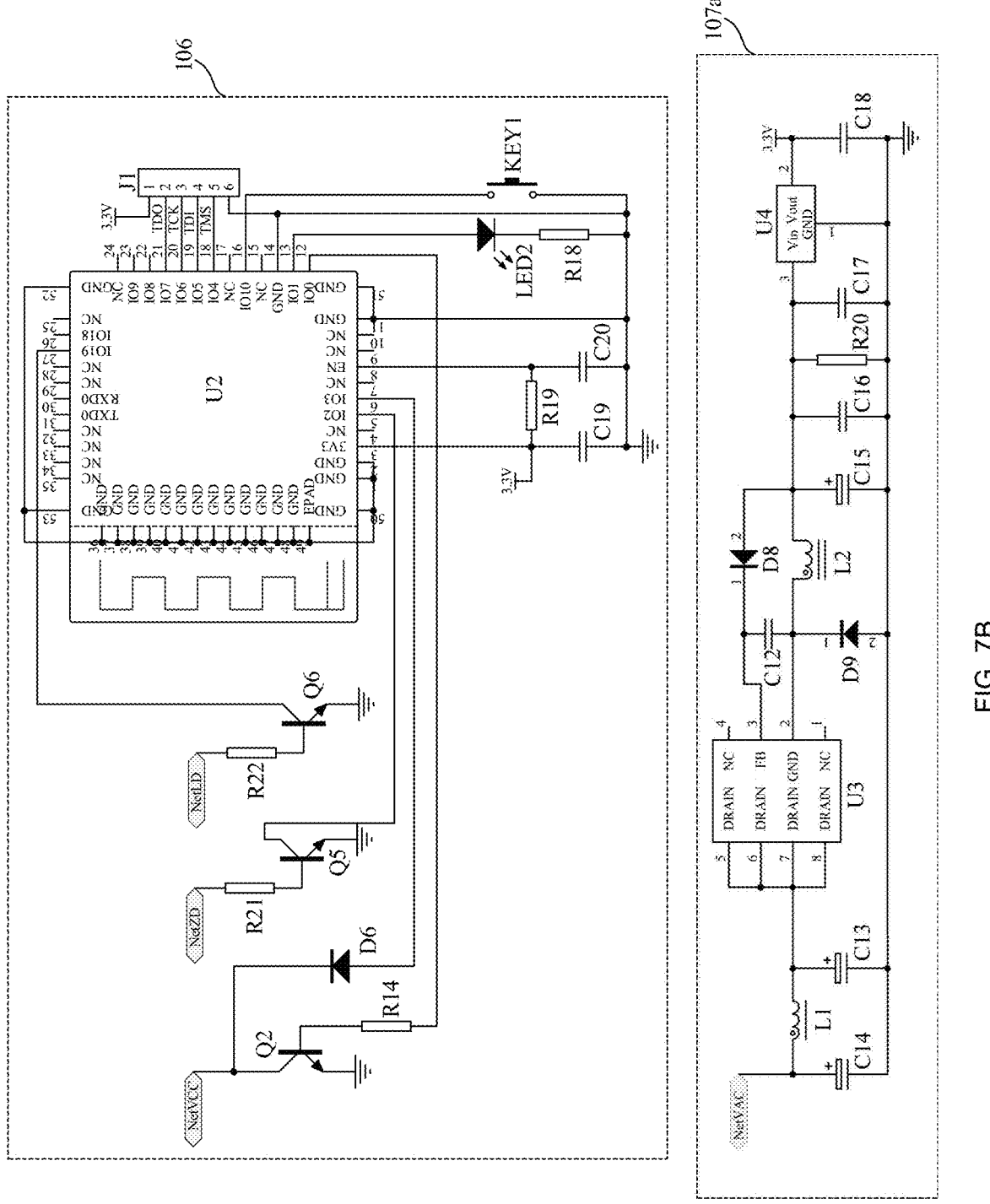

FIGS. 7A and 7B illustrate an exemplary circuit that implements the fourth embodiment shown in FIG. 5. The input end 101 and output end 102, switch module 103, leakage current detection module 104, signal processing circuit 142, drive module 105, drive coil 151, drive circuit

152, wireless communication module 106, and power supply modules 107*a* and 107*b* shown in FIGS. 7A and 7B respectively correspond to the components in FIG. 5 with the same reference symbols. The connection points labeled NetVCC, NetVAC, NetZD and NetLD in FIG. 7A respectively correspond to the connection points with the same labels in FIG. 7B.

As shown in FIG. 7B, the wireless communication module 106 includes a semiconductor chip U2 (a signal processing chip) that performs various signal processing and communication functions. The wireless communication module 106 further includes three semiconductor switches Q2, Q5 and Q6. The current path of semiconductor switch Q2 is coupled between NetVCC and ground, and its control electrode is coupled to an output pin IO0 of the chip U2. The current path of semiconductor switch Q5 is coupled between a pin IO2 of the chip U2 and ground, and its control electrode is coupled to NetZD. The current path of semiconductor switch Q6 is coupled between a pin IO19 of the chip U2 and ground, and its control electrode is coupled to NetLD. A pin IO3 of the chip U2 is coupled to NetVCC.

The operations of the circuit shown in FIGS. 7A and 7B are as follows. Under normal working conditions, when the input terminal 101 is powered on, a current flows through the current path HOT-C6-DB1 to charge capacitor C7. The voltage across the two ends of capacitor C7 is divided by resistors R11 and R13. As the voltage across the two ends of capacitor C7 increases, the voltage across R13 also increases. When it reaches the trigger voltage of the silicon controlled rectifier Q3, Q3 becomes conductive, and a current flows through the solenoid SOL1, generating a large magnetic field, which drives the switch module 103 to connect the power connection between the input terminal 101 and the output terminal 102.

A current also flows through the path HOT-D1-R4 to supply the leakage processing chip U1. When a leakage current occurs on the current carrying lines 21 or 22, the leakage current signal is detected by the leakage current detection ring CT1 and processed by the leakage processing chip U1. If it exceeds a pre-set leakage fault threshold, the chip U1 outputs a high voltage level at pin 5 which, through D3-R10, triggers the silicon controller rectifier Q1 to conduct so that a current no longer passes through SOL1-Q3-GND, but rather, through D4-Q1-GND. The magnetic field on the coil SOL1 disappears, causing the switch module 103 to disconnect the power connection between the input terminal 101 and the output terminal 102, thereby accomplishing leakage protection.

Further, a current also charges capacitor C11 through the current path HOT-D7-R3. When the voltage at the upper end of C11 exceeds the triggering threshold of trigger diode ZD1, ZD1 conducts. As a result, a current flows through detection ring CT1 via R5, simulating a leakage current. At the same time, the current charges capacitor C8 through R9. When the detection ring CT1 detects the simulated leakage current signal, it is processed by the leakage processing chip U1 which generates a high voltage level at its pin 5. The current charges C10 through D3-R10, and also through R17 triggers Q4 to conduct, quickly releasing the charge on C11. The voltage at the upper end of C11 rapidly drops, causing ZD1 to cut off, which in turn causes pin 5 of U1 to become low. Due to the extremely short time of this process, the voltages across C8 and C10 are low, which is insufficient to trigger Q1 to conduct. As a result, the switch module 103 remains connected. When the leakage detection module 104 has a fault, the simulated leakage current no longer causes pin 5 of the leakage processing chip U1 to generate a high voltage level. As a result, ZD1 remains conductive for a long time, causing the voltage at the upper end of C8 to be relatively high. This high voltage level, through D5-R10, triggers Q1 to conduct. As a result, the current no longer flows through SOL1. The magnetic field of SOL1 disappears, and the switch module 103 disconnects the power connection between the input terminal 101 and the output terminal 102, thereby achieving a circuit fault self-test function. The components C11, D7, R3, ZD1, R5, C8, R9, R17, and Q4 form a self-test circuit, which is coupled to the signal processing circuit 142 and the drive circuit 152.

The current also flows from the HOT line via D7 through the power module 107a, which is a universal switching power supply circuit that stabilizes the high voltage input from D7 to 3.3V, so as to supply power to the wireless communication module 106. In the wireless communication module 106, the input/output block J1 is used for programming the chip U2, while the switch KEY1 is used for resetting. When the chip U2 detects that the input port IO10 (coupled via KEY1 to ground) is at a low voltage level, it puts the wireless communication module 106 in Bluetooth pairing state. At the same time, the output port 101 outputs a pulse voltage signal to control LED2 to flash, indicating that it is in the pairing state. When pairing with a user's remote control device (such as a mobile phone, tablet, etc.) is completed, the LED2 turns to constant light, indicating successful pairing. After successful pairing, the wireless communication module 106 can be connected to a desired WIFI through a mobile app on the remote control device. At this point, communication between the leakage protection device and remote devices can be achieved.

When the wireless communication module 106 receives a disconnection signal sent by the user's remote control device, the IO0 pin of the chip U2 outputs a high voltage level, triggering Q2 to remain conductive, forming a current path from NetVCC to ground. As seen in FIG. 7A, because the current path of Q2 is parallel to the current path of the solenoid SOL1 (R8-SOL1-Q3), the current no longer flows through solenoid SOL1. As a result, the magnetic field of SOL1 disappears, which causes the switch module 103 to disconnect the power connection between the input terminal 101 and the output terminal 102. When the wireless communication module 106 receives a connection signal from the user's remote control device, the IO0 pin of chip U2 outputs a low voltage level, so that Q2 is turned off, and the current flows through SOL1 again. As a result, SOL1 generates a magnetic field to drive switch module 103 to connect the power connection between input terminal 101 and output terminal 102. This achieves remote control of the power connection between the input terminal 101 and the output terminal 102.

When the wireless communication module 106 receives a timing control command from the user's remote control device, the chip U2 uses its internal clock and program settings to perform a timing function, and output a high voltage level at pin IO0 at the time prescribed by the timing control command. This voltage triggers Q2 to remain conductive, so that the current no longer flows through SOL1 and the power connection between the input terminal 101 and the output terminal 102 is disconnected. Thus, functions and control parameters of the leakage current protection device can be set remotely. Other timing functions may be similarly performed.

When Q1 is conducting and chip U2 does not send a disconnection signal, the input pin IO3 of the chip U2 will detect a low voltage level at the point NetVCC. In this condition, if the input pin IO2 of the chip U2 (which is coupled to Q5) detects a low level for longer than a predetermined time interval (e.g. 1 ms) (this is due to the output terminal of ZD1 (point NetZD) being in a high voltage level for a long time, triggering transistor Q5 to conduct), the chip U2 determines that a self-test fault is present. In response, the chip U2 sets a self-test fault flag, which can be read by the remote control device. If the input pin IO2 does not detect a low voltage level (i.e. not during self-test), and the input pin IO19 of the chip U2 (which is coupled to Q6) detects a low voltage level (due to pin 5 of the leakage processing chip U1 (point NetLD) being at a high voltage level, triggering Q6 to conduct), the chip U2 determines that a leakage fault is present. In response, the chip U2 sets a leakage fault flag, which can be read by the remote control device. If neither pin IO2 nor pin IO19 detects a low voltage level, it indicates that no self-test fault or leakage fault is present (the reset button may have been operated), and in response, the chip U2 does not set the self-test or leakage fault flag. This way, the remote control device can access electrical and/or fault information of the leakage protection device.

The chip U2 may be programmed to perform all the communication and control functions described earlier for the embodiments of FIGS. 1-5.

The wireless communication modules 106 for the embodiments shown in FIGS. 2, 3 and 4 have structures similar to that shown in FIGS. 7A and 7B, i.e., the wireless communication module 106 includes a signal processing chip and one or more semiconductor switches that couple various pins of the signal processing chip to the signal processing circuit 142 of the leakage current detection module 104 and/or the drive circuit 152 of the drive module 105.

Figure 7C:
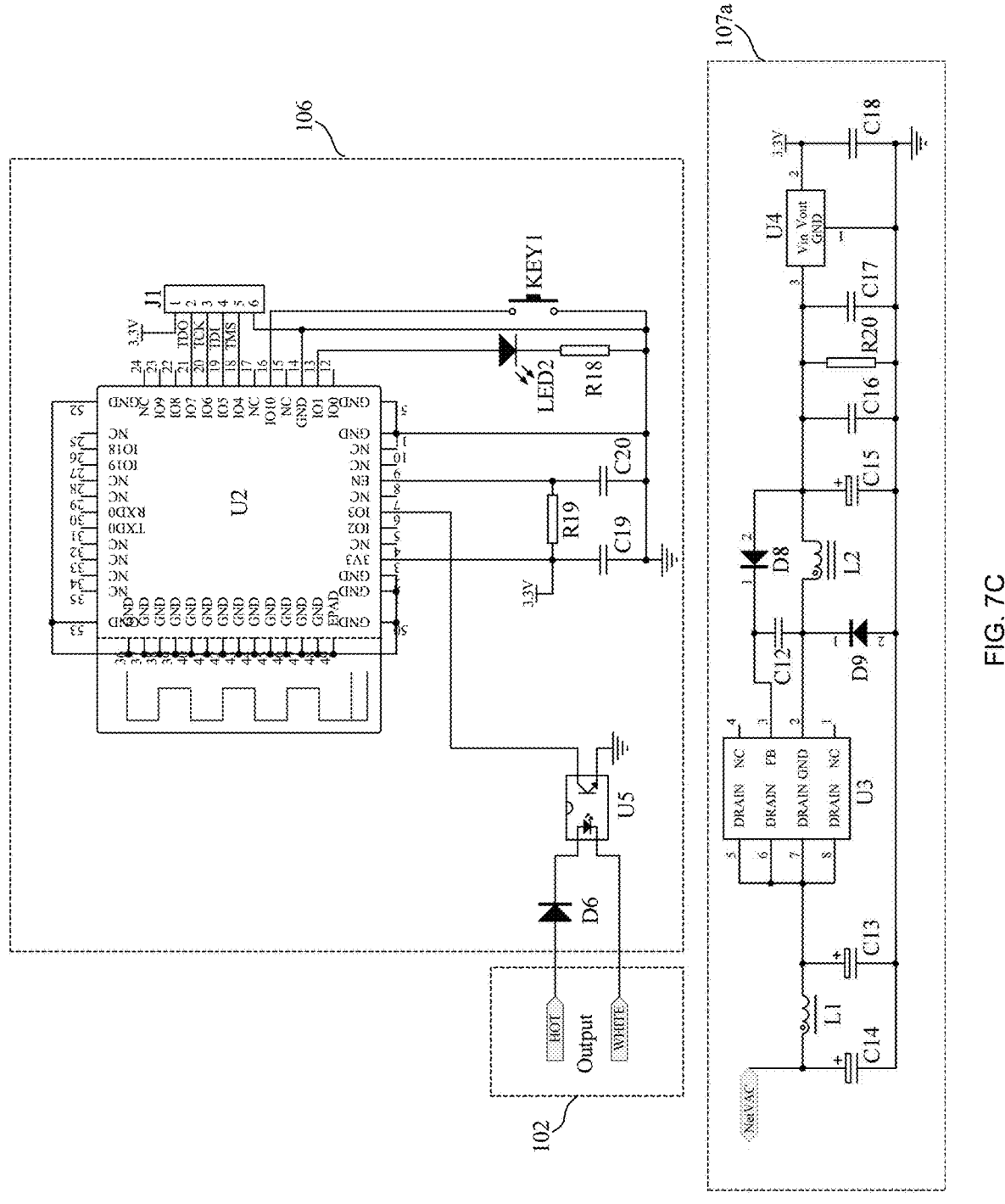

An exemplary circuit that implements the fifth embodiment shown in FIG. 6 is illustrated in FIGS. 7A and 7C. The structure and operation of the circuit of FIG. 7A have been described above. To implement the embodiment of FIG. 6, a wireless communication module 106 shown in FIG. 7C is coupled to the output terminal 102. The wireless communication module 106 includes a semiconductor chip U2 (a signal processing chip) that performs various signal processing and communication functions. The wireless communication module 106 further includes a photocoupler U5 to couple the input pin IO3 of the chip U2 is to the output terminal 102.

When components of the leakage current detection and interruption device 600 are operating normally, the input terminal 101 and the output terminal 102 are electrically connected to each other and the output terminal 102 is powered. A current flows through HOT-D6-U5-WHITE and drives the output side of the photocoupler to be conductive. As a result, the input pin IO3 of chip U2 detects a low voltage level. In response the chip U2 sets a "normal" flag, which indicates that the leakage current detection and interruption device is operating normally and the input and output ends 101 and 102 are electrically connected. On the other hand, if the input pin IO3 detects a high voltage, the chip U2 sets a "abnormal" flag, which indicates that the leakage current detection and interruption device is tripped and the output terminal 102 has lost power. The "normal" or "abnormal" flag may be read out by the remote control device or transmitted to the remote device as described earlier. This enables the remote device to remotely obtain information about the operational state of the leakage current detection and interruption device.

In a second aspect, the present invention provides an electrical power connection device, which includes a body, and a leakage current detection and interruption device of any of the above embodiments disposed inside the body.

In a third aspect, the present invention provides an electrical appliance, which includes an electrical load and an electrical power connection device coupled between a power supply and the electrical load and configured to supply power to the electrical load, where the electrical power connection device includes a leakage current detection and interruption device of any of the above embodiments.

While the present invention is described above using specific examples, these examples are only illustrative and do not limit the scope of the invention. It will be apparent to those skilled in the art that various modifications, additions and deletions can be made to the leakage current detection and interruption device of the present invention without departing from the spirit or scope of the invention.

What is claimed is:

1. A leakage current detection and interruption device, comprising:
   a switch module, including a reset switch, coupled to power supply lines between an input end and an output end and configured to control an electrical connection between the input end and the output end;
   a leakage current detection module, including at least one leakage current detection ring and a signal processing circuit coupled to the at least one leakage current detection ring, configured to detect a leakage current on the power supply lines and to generate a leakage fault signal in response thereto;
   a drive module, including a drive coil and a drive circuit coupled in series to the drive coil, coupled to the leakage current detection module and the switch module, and configured to control the switch module to disconnect or connect the electrical connection between the input end and output end;
   a wireless communication module, including a signal processing chip and one or more semiconductor switches, wherein the signal processing chip is coupled to the drive module and/or the leakage current detection module via the one or more semiconductor switches, and configured to wirelessly communicate with a remote control device to allow the remote control device to perform at least one of: controlling the switch module to disconnect or connect the electrical connection between the input end and output end, setting parameters of the leakage current detection and interruption device, and obtaining electrical information and/or fault information of the leakage current detection and interruption device; and
   at least one power supply circuit, configured to supply a power to the leakage current detection module and the wireless communication module.

2. The leakage current detection and interruption device of claim 1, wherein the wireless communication module is configured to operate in a timed control mode, wherein in the timed control mode, the wireless communication module is configured to:
   receive control data from the remote control device, and
   in response to the control data including a control timing, control the switch module to disconnect or connect the electrical connection between the input end and output end based on the control data at a time indicated by the control timing.

3. The leakage current detection and interruption device of claim 2, wherein the wireless communication module is configured to:

in response to the control data not including a timing of the commanded operation, control the switch module to disconnect or connect the electrical connection between the input end and output end based on the control data at a time that is either a pre-set timing or a timing indicated by a last control data.

4. The leakage current detection and interruption device of claim 2, wherein the wireless communication module is further configured to perform a countdown based on the control timing, and to
   either transmit countdown information to the remote control device at pre-set time intervals, or transmit the countdown information to the remote control device in response to a request from the remote control device.

5. The leakage current detection and interruption device of claim 2, wherein the wireless communication module controls the switch module to disconnect or connect the electrical connection between the input end and output end based on the control data by:
   generating a drive module trigger signal based on the control data; and
   providing the drive module trigger signal to the drive module or the leakage current detection module; and
   wherein in response to the drive module trigger signal, the drive module controls the switch module to disconnect or connect the electrical connection between the input end and output end.

6. The leakage current detection and interruption device of claim 1, wherein the wireless communication module is configured to operate in a real-time control mode, wherein in the real-time control mode, the wireless communication module receives control data from the remote control device, and controls the switch module to disconnect or connect the electrical connection between the input end and output end based on the control data.

7. The leakage current detection and interruption device of claim 2, wherein the wireless communication module controls the switch module to disconnect or connect the electrical connection between the input end and output end based on the control data by:
   generating a drive module trigger signal based on the control data; and
   providing the drive module trigger signal to the drive module or the leakage current detection module; and
   wherein in response to the drive module trigger signal, the drive module controls the switch module to disconnect or connect the electrical connection between the input end and output end.

8. The leakage current detection and interruption device of claim 1, wherein the wireless communication module is further configured to:
   receive the leakage fault signal and store fault information corresponding to the leakage fault signal; and
   generate a fault alarm signal based on the leakage fault signal, and transmit the alarm signal to the remote control device either at a time of generating the fault alarm signal or in response to a request from the remote control device.

9. The leakage current detection and interruption device of claim 1, wherein the wireless communication module includes a semiconductor switch having its control electrode coupled to an output pin the chip and its current path coupled in parallel with a current path of the drive coil of the drive module.

10. The leakage current detection and interruption device of claim 1, wherein the wireless communication module includes a semiconductor switch having its control electrode coupled to an output of the signal processing circuit of the leakage current detection module and its current path coupled to an input pin of the signal processing chip.

11. The leakage current detection and interruption device of claim 1, further comprising a self-test circuit coupled to the signal processing circuit and the drive circuit and configured to perform self-test for the leakage current detection module, wherein the wireless communication module includes a semiconductor switch having its control electrode coupled to an output of the self-test circuit and its current path coupled to an input pin of the signal processing chip.

12. An electrical power connection device, comprising:
a body; and
a leakage current detection and interruption device of claim 1, disposed inside the body.

13. An electrical appliance, comprising:
an electrical load; and
an electrical power connection device coupled between a power supply and the electrical load, configured to supply power to the electrical load, wherein the electrical power connection device includes a leakage current detection and interruption device of claim 1.

14. A leakage current detection and interruption device, comprising:
a switch module, including a reset switch, coupled to power supply lines between an input end and an output end and configured to control an electrical connection between the input end and the output end;
a leakage current detection module, including at least one leakage current detection ring and a signal processing circuit coupled to the at least one leakage current detection ring, configured to detect a leakage current on the power supply lines and to generate a leakage fault signal in response thereto;
a drive module, including a drive coil and a drive circuit coupled in series to the drive coil, coupled to the leakage current detection module and the switch module, and configured to control the switch module to disconnect or connect the electrical connection between the input end and output end;
a wireless communication module, including a signal processing chip and a photocoupler, wherein the signal processing chip is coupled to the output end of the power supply lines via the photocoupler, and configured to detect a power loss at the output end, wherein the wireless communication module is further configured to wirelessly transmit information regarding the power loss to a remote control device; and
at least one power supply circuit, configured to supply a power to the leakage current detection module and the wireless communication module.

15. The leakage current detection and interruption device of claim 14, wherein the wireless communication module is configured to transmit the information regarding the power loss to the remote control device upon detecting the power loss.

16. The leakage current detection and interruption device of claim 14, wherein the wireless communication module is configured to store the information regarding the power loss, and to transmit the information regarding the power loss to the remote control device in response to a request from the remote control device.

17. An electrical power connection device, comprising:
a body; and
a leakage current detection and interruption device of claim 14, disposed inside the body.

18. An electrical appliance, comprising:
an electrical load; and
an electrical power connection device coupled between a power supply and the electrical load, configured to supply power to the electrical load, wherein the electrical power connection device includes a leakage current detection and interruption device of claim 14.

19. A leakage current detection and interruption device, comprising:
a switch module, including a reset switch, coupled to power supply lines between an input end and an output end and configured to control an electrical connection between the input end and the output end;
a leakage current detection module, including at least one leakage current detection ring and a signal processing circuit coupled to the at least one leakage current detection ring, configured to detect a leakage current on the power supply lines and to generate a leakage fault signal in response thereto;
a drive module, including a drive coil and a drive circuit coupled in series to the drive coil, coupled to the leakage current detection module and the switch module, and configured to control the switch module to disconnect or connect the electrical connection between the input end and output end;
a wireless communication module including a signal processing chip, coupled to the drive module and/or the leakage current detection module and/or the output end of the power supply lines, and configured to wirelessly communicate with a remote control device to allow the remote control device to perform at least one of: controlling the switch module to disconnect or connect the electrical connection between the input end and output end, setting parameters of the leakage current detection and interruption device, and obtaining electrical connection information and/or fault information of the leakage current detection and interruption device; and
at least one power supply circuit, configured to supply a power to the leakage current detection module and the wireless communication module.

20. An electrical power connection device, comprising:
a body; and
a leakage current detection and interruption device of claim 19, disposed inside the body.

21. An electrical appliance, comprising:
an electrical load; and
an electrical power connection device coupled between a power supply and the electrical load, configured to supply power to the electrical load, wherein the electrical power connection device includes a leakage current detection and interruption device of claim 19.

* * * * *